United States Patent
Chen et al.

(10) Patent No.: US 10,276,468 B2
(45) Date of Patent: Apr. 30, 2019

(54) CIRCUIT PACKAGE (71) Applicant: HEWLETT-PACKARD DEVELOPMENT COMPANY, L.P., Houston, TX (US)

(72) Inventors: Chien-Hua Chen, Corvallis, OR (US); Michael W Cumbie, Albany, OR (US); Stephen Farrar, Albany, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/544,798

(22) PCT Filed: Mar. 27, 2015

(86) PCT No.: PCT/US2015/023020
§ 371 (c)(1),
(2) Date: Jul. 19, 2017

(87) PCT Pub. No.: WO2016/159934
PCT Pub. Date: Oct. 6, 2016

(65) Prior Publication Data
US 2018/0012816 A1    Jan. 11, 2018

(51) Int. Cl.
*H01L 23/31* (2006.01)
*H01L 21/56* (2006.01)
*H01L 23/00* (2006.01)

(52) U.S. Cl.
CPC ........ *H01L 23/3135* (2013.01); *H01L 21/561* (2013.01); *H01L 21/565* (2013.01); *H01L 24/96* (2013.01); *H01L 2924/10253* (2013.01); *H01L 2924/3511* (2013.01)

(58) Field of Classification Search
CPC . H01L 23/3135; H01L 21/561; H01L 21/565; H01L 24/96
See application file for complete search history.

(56) References Cited

U.S. PATENT DOCUMENTS

| | | |
|---|---|---|
| 7,179,689 B2 | 2/2007 | Matayabas et al. |
| 8,388,778 B2 | 3/2013 | Karlinski et al. |
| 8,585,180 B2 | 11/2013 | Bhowmik et al. |
| 9,768,038 B2 * | 9/2017 | Lin ................. H01L 21/568 |
| 2004/0224081 A1 * | 11/2004 | Sheu ................. B82Y 10/00 427/58 |
| 2004/0262749 A1 * | 12/2004 | Matayabas, Jr. .... H01L 23/3121 257/734 |
| 2006/0016780 A1 | 1/2006 | Bengali |
| 2009/0244180 A1 | 10/2009 | Panchawagh et al. |
| 2010/0184256 A1 * | 7/2010 | Chino ............. H01L 21/561 438/118 |

(Continued)

FOREIGN PATENT DOCUMENTS

CN    101410740    4/2009

OTHER PUBLICATIONS

Flaschsbart, et al. Lab on a Chip. Mar. 17, 2006. Design and fabrication of a multilayered polymer microfluidic chip with nanofluidic interconnects via adhesive contact printing.

*Primary Examiner* — Nathan W Ha
(74) *Attorney, Agent, or Firm* — HP Inc. ~ Patent Department (57) ABSTRACT

A circuit package comprises a circuit device in a first epoxy mold compound and a second epoxy mold compound of different compositions.

16 Claims, 8 Drawing Sheets

(56) References Cited

U.S. PATENT DOCUMENTS

| | | | |
|---|---|---|---|
| 2012/0018884 A1* | 1/2012 | Lin | H01L 23/3107 |
| | | | 257/738 |
| 2012/0033017 A1 | 2/2012 | Iwanaga et al. | |
| 2012/0104435 A1 | 5/2012 | Lee et al. | |
| 2012/0268899 A1* | 10/2012 | Haba | H01L 21/568 |
| | | | 361/728 |
| 2013/0082389 A1* | 4/2013 | Crisp | H01L 25/0655 |
| | | | 257/773 |
| 2013/0087916 A1* | 4/2013 | Lin | H01L 24/19 |
| | | | 257/738 |
| 2013/0175686 A1* | 7/2013 | Meyer | H01L 25/0655 |
| | | | 257/738 |
| 2013/0337614 A1 | 12/2013 | Fuergut et al. | |
| 2013/0341800 A1* | 12/2013 | Tu | H01L 21/78 |
| | | | 257/774 |
| 2014/0091460 A1 | 4/2014 | Lee et al. | |
| 2014/0218437 A1 | 8/2014 | Ciampini et al. | |
| 2015/0029265 A1 | 1/2015 | Iwanaga et al. | |
| 2015/0255361 A1* | 9/2015 | Lee | H01L 23/3135 |
| | | | 257/738 |
| 2016/0225669 A1* | 8/2016 | Choi | H01L 21/78 |
| 2017/0271227 A1* | 9/2017 | Liao | H01L 21/561 |
| 2018/0025960 A1* | 1/2018 | Chen | B81B 7/0061 |
| | | | 257/790 |
| 2018/0130760 A1* | 5/2018 | Wang | H01L 21/027 |

* cited by examiner

CIRCUIT PACKAGE

BACKGROUND

Circuits such as integrated circuits are oftentimes packaged in an epoxy mold compound packaging to support and protect the circuitry. Depending on the manufacturing method used, it may be difficult to control dimensions, shapes or certain properties of packaged circuits.

BRIEF DESCRIPTION OF THE DRAWINGS

For the purpose of illustration, certain examples constructed in accordance with this disclosure will now be described with reference to the accompanying drawings, in which:

FIG. 11B illustrates a diagram of an example circuit package after compression molding the circuit and package materials of FIG. 11a.

DETAILED DESCRIPTION

In the following detailed description, reference is made to the accompanying drawings. The examples in the description and drawings should be considered illustrative and are not intended as limiting to the specific example or element described. Multiple examples can be derived from the following description and drawings through modification, combination or variation of the different elements.

Figure 1:
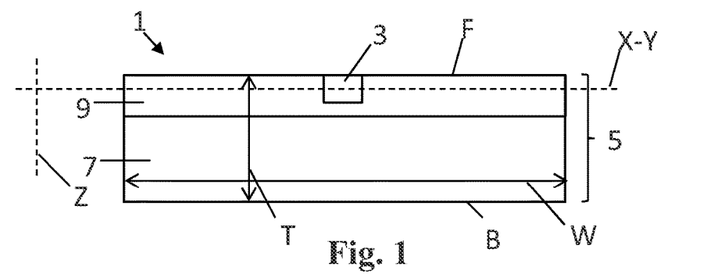
FIG. 1 illustrates a diagram of an example circuit package.

FIG. 1 illustrates an example of a circuit package 1. The circuit package 1 includes a circuit device 3 and a packaging 5. The packaging 5 serves to support and protect the circuit device 3. In an example additional circuitry may run through the packaging 5, connected to the circuit device 3. The packaging 5 comprises a first epoxy mold compound 7 with a first CTE (Coefficient of Thermal Expansion) and a second epoxy mold compound 9 with a second CTE that is higher than the first CTE. The second epoxy mold compound 9 is disposed adjacent to the circuit device 3, for example so as to influence a bow near a package face that includes the circuit device 3.

In one example, the circuit package 1 is substantially panel-shaped. The panel-shaped circuit package 1 may have a front surface F and a back surface B. Both the circuit device 3 and the second epoxy mold compound 9 extend near the front surface F. In the illustrated example, the second epoxy mold compound 9 extends in the same plane X-Y as the circuit device 3, wherein the plane X-Y extends parallel to the front and back surface F, B of the panel, and near the front surface F. For example, most of the volume of the package 5 is formed by the first epoxy mold compound 7. In the illustrated example, the first epoxy mold compound 7 extends below the second epoxy mold compound 9 up to the back surface B.

The circuit package 1 has a panel shape in the sense that it has a thickness T, between a back and front surface B, F, that is much less than its width W or length. For example its thickness T can be at least five times, or at least ten times its width W and/or length (in the drawing, the length extends into the page). In the drawing, the thickness extends in a Z-direction while the length and width W extend parallel to the X-Y plane.

The circuit device 3 may include metal and/or semiconductor components such as silicon. The circuit device 3 has a lower CTE than the first epoxy mold compound 7. In an example the circuit device 3 includes approximately 3.1 parts per million per ° C. rise in temperature (ppm/C).

In certain examples the circuit package 1 is manufactured by compression molding. In again further examples, before compression molding the circuit devices 3 in the packaging 5, the epoxy mold compounds are provided in granular, powder, layered and/or B-staged sheet form. Compression molding may involve heating the layers, sheets or granular epoxy mold compounds in a mold, compressing the circuit devices and compounds to form the package 1 and cooling the package 1. In certain examples, the circuit devices comprise conductor and/or semi-conductor materials. Hence, the thermal expansion of the circuit device 3 and the thermal expansion of the first epoxy mold compound 7 are different. Thus, warpage could occur during cooling, if the circuit device 3 would be packaged in the first epoxy mold compound only.

In some of the examples of this disclosure, a second epoxy mold compound 9 with an even higher CTE is deposited adjacent to the circuit device 3 to control said warpage or bow. For example, the second epoxy mold compound 9 is disposed in a strategic quantity (e.g. thickness, surface) and location near the circuit device 3, so as to influence an overall CTE of a "composite" portion of the package 1 that incorporates both the circuit device 3 and the second epoxy mold compound 9, near the front surface F. For example the CTE of the composite portion is such that the thermal expansion of the composite portion compensates for the thermal expansion of the opposite back portion that may substantially consist of the first epoxy mold compound 7.

In certain examples, when a circuit device is packaged in a single epoxy mold compound, the resulting circuit package may curve into a shape that is convex at the front surface F where the circuit device is located, and concave at the opposite, back surface B. To counter such undesired curving, a thin layer of a second epoxy mold compound 9 with a higher CTE than the first epoxy mold compound 7 can be disposed near the circuit devices 3. By disposing a layer of the second epoxy mold compound, an overall thermal expansion (or shrinking) of the composite layer during cooling may be similar, or of inverse shape, as the thermal expansion near the back surface B. Thereby the layer of the second epoxy mold compound may compensate for the deformation near the back surface. Positions, shapes and quantities of the second epoxy mold compound 9 and the first epoxy mold compound 7 can be varied to control a bow or warpage of the circuit package 1. By having a better control over panel bow in compression molded circuit packages, certain design constraints can be relieved, such as circuit device thickness (versus length and width), number of circuit devices in a packaging, packaging thickness, mold temperature settings, substrate handling downstream of a compression mold such as an electrical redistribution layer (RDL) fabrication process, packaging clamping during cooling, and more. Further example circuit packages are described below.

Figure 2:
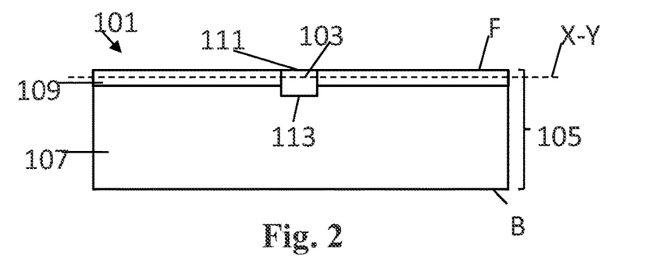
FIG. 2 illustrates a diagram of another example circuit package.

FIG. 2 illustrates another example circuit package 101. The circuit package 101 may be panel shaped and includes a packaging 105 and a circuit device 103. The circuit package 101 includes a relatively thin second layer of a second epoxy mold compound 109 that is disposed over a first layer of a first epoxy mold compound 107. The second epoxy mold compound 109 has a higher CTE than the first epoxy mold compound 107. The second epoxy mold compound 109 may have a lower filler density than the first epoxy mold compound 107. The circuit device 103 extends in or near a front surface F. The second layer of the second epoxy mold compound 109 extends in the same plane X-Y as the circuit device 103. The plane X-Y extends parallel to the front surface F and a back surface B of the circuit package 101, near the front surface F. In one example, the first epoxy mold compound 107 forms the bulk of the packaging 105 and forms the back surface B of the packaging 105.

In the illustrated example, the second layer of the second epoxy mold compound 109 is thinner than a height of the circuit device 103 so that a front portion 111 of the circuit device 103 extends in the second epoxy mold compound 109 while a back portion 113 of the circuit device 103 extends in the first epoxy mold compound 107 that extends below the second epoxy mold compound 109. During compression molding, the circuit device 103 may be deposited into and partly through the second epoxy mold compound 109 so that the back portion 113 sits in the first epoxy mold compound 107. This example may work where only a thin slice of the high CTE epoxy mold compound 109 is desired to control panel bow.

Figure 3:
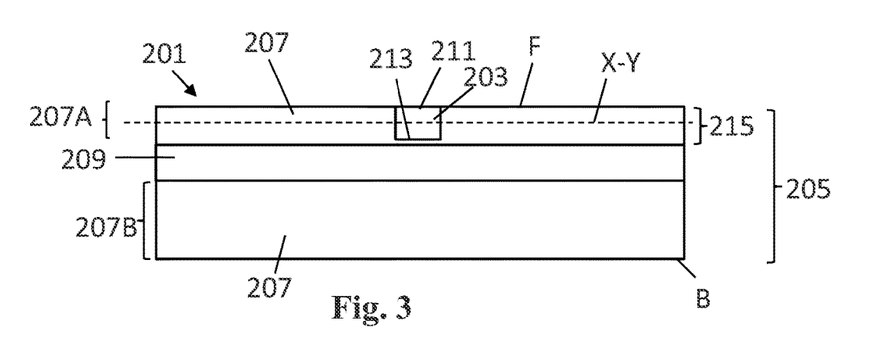
FIG. 3 illustrates a diagram of another example circuit package.

FIG. 3 illustrates another example circuit package 201. The circuit package 201 may be panel shaped and includes a packaging 205 and a circuit device 203 in the packaging 205. The circuit package 201 has a front and back surface F, B, respectively. The packaging 205 includes layers of a first epoxy mold compound 207 of a first CTE and a second epoxy mold compound 209 of a second CTE higher than the first CTE. The layer of the second epoxy mold compound 209 extends near the circuit device 203 and near the front surface F, parallel to a plane X-Y through the circuit device 203. In the drawing, the second epoxy mold compound 209 extends under the circuit device 203 and under the plane X-Y. Two layers 207A, 207B of the first epoxy mold compound 207 extends along the front and back side, respectively, of the second epoxy mold compound 209. A relatively thin layer 207A of the first epoxy mold compound 207 extends in the same plane X-Y as the circuit device 203, at the front surface F and parallel to the front surface F. In the example, the circuit device 203 is fully deposited in that layer 207A of the first epoxy mold compound 207. A back layer 207B of the first epoxy mold compound 207, which may represent most of the volume of the packaging 205, extends on the opposite side of the second epoxy mold compound 209, at the back of the packaging 205. As a result, the overall panel warpage can be controlled or reduced, relative to a package of a single epoxy compound.

In the example of FIG. 3, the second epoxy mold compound 209 may compensate for a bow that could otherwise be caused by the different CTEs of the circuit device 203 and the first epoxy mold compound 207. For example, the second epoxy mold compound 209 is close enough to the front surface F and/or circuit devices 203 to influence an overall thermal expansion near the front surface F, to compensate for the thermal expansion near the back surface B of the compression molded package 201.

In another example that is similar to FIG. 3, the front first epoxy mold compound layer 207A may be thinner and the second epoxy mold compound layer could be moved upwards so that it touches the circuit device 203. A back portion 213 of the circuit device 203 would then be disposed in the second epoxy mold compound 209 and a front portion of the circuit device 203 in the first epoxy mold compound 207.

Figure 4:
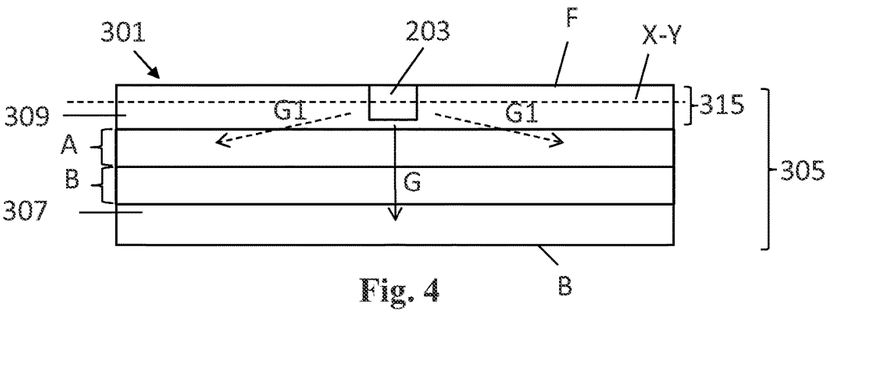
FIG. 4 illustrates a diagram of another example circuit package.

FIG. 4 illustrates another example of a circuit package 301. The circuit package 301 includes a circuit device 303 and a packaging 305. The packaging 305 includes a first epoxy mold compound 307 near a back surface B and a second epoxy mold compound 309 near a front surface F, wherein the second epoxy mold compound 309 has a higher CTE than the first epoxy mold compound 307. The second epoxy mold compound 309 is disposed in a plane X-Y that extends through the circuit device 303 parallel to the front and back surface F, B of the package 301, near the front surface F. The first epoxy mold compound 307 is disposed near a back surface B.

The CTE of the packaging 305 decreases gradually, for example in steps or layers A, B, from a front surface F to a back surface B. The CTE can decrease in a direction G away from a circuit device layer 315, for example in a direction G perpendicular to said plane X-Y through the circuit devices 303. In other examples, as illustrated with dotted arrows G, G1, the epoxy mold compounds 307, 309 are disposed in the packaging 305 so that the CTE decreased in multiple directions G, G1 away from the circuit device 303. In an example the packaging 305 contains 100% first epoxy mold compound of a first CTE near the back surface B and 100% second epoxy mold compound of a second CTE near the front surface F.

Figure 5:
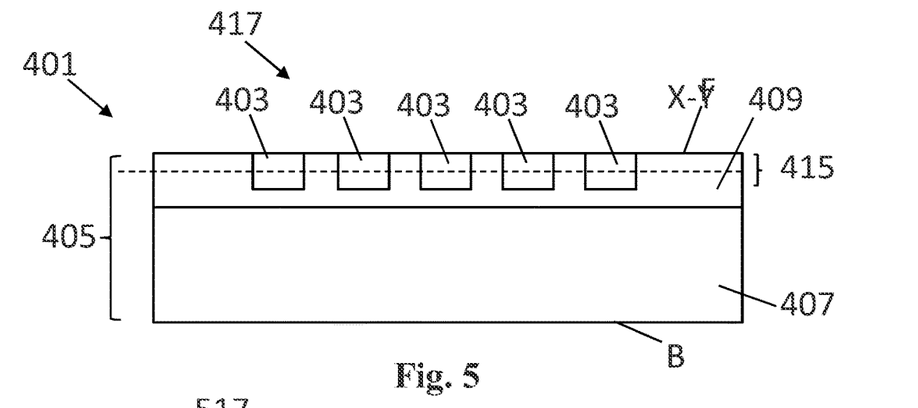
FIG. 5 illustrates a diagram of another example circuit package.

FIG. 5 illustrates an example of a circuit package 401, including a packaging 405 and a circuit device 403. The circuit package 401 includes an array 417 of circuit devices 403 in a circuit device layer 415. The circuit device layer 415 may be provided near a front surface F of the circuit package 401. In the circuit device layer 415, the circuit devices 403 of the array 417 extend next to each other, for example in columns and/or rows. In the example, the circuit devices 403 extend up to the front surface F.

The packaging 405 includes a first epoxy mold compound 407 and a second epoxy mold compound 409 having a higher CTE than the first compound. In the illustrated example, the first epoxy mold compound 407 forms a back portion of the packaging 401 near a back surface B. The first epoxy mold compound 407 may form the bulk of the material of the packaging 405. The second epoxy mold compound 409 extends near the front surface F in the same plane X-Y as the circuit device array 417.

The circuit device array 417 may be applied to each of the examples of this description. For example, each of the individual circuit devices 3, 103, 203, 303 of each of the examples of FIG. 1-4 could actually be an array 417 of circuit devices as in FIG. 5 wherein the array 417 extends in the respective first and/or second epoxy mold compound layer.

Figure 6:
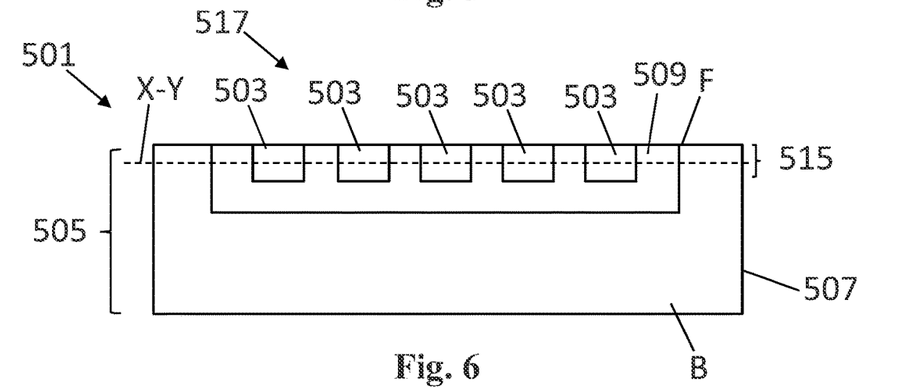
FIG. 6 illustrates a diagram of another example circuit package.
Figure 7:
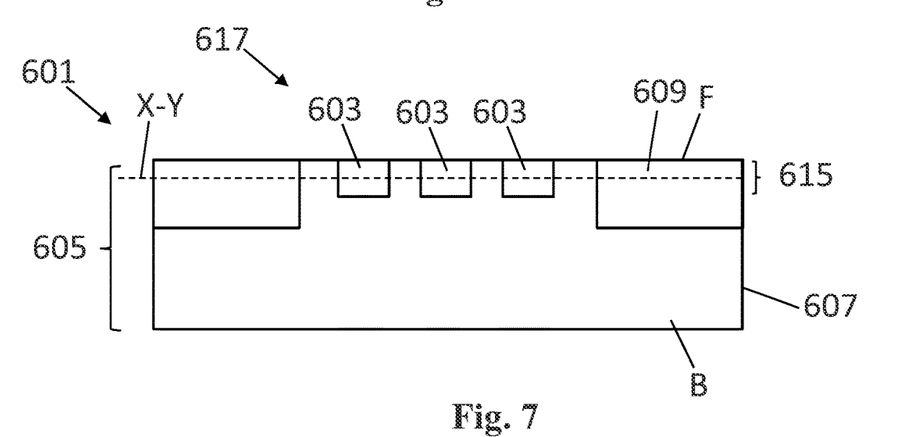
FIG. 7 illustrates a diagram of another example circuit package.

FIGS. 6 and 7 illustrate different examples of circuit packages 501, 601, wherein the second epoxy mold compound 509, 609 of higher a CTE is patterned in a first epoxy mold compound 507, 607, in a plane X-Y through the circuit devices 503, 603 near the front surface F. Here, a pattern may be interpreted as the second epoxy mold compound 509, 609 spanning a selective portion of a panel surface only. Here, the first epoxy mold compound 509, 609 spans the entire panel surface. In FIG. 6, the circuit devices 503 are disposed in the second epoxy mold compound 509. In FIG. 7, the circuit devices 603 are disposed in the first epoxy mold compound 607 and the second epoxy mold compound 609 extends next to the circuit array 617 and next to and on top of the first epoxy mold compound 607. In both examples, the second epoxy mold compound 509, 609 extends near the circuit devices 503, 603, in a circuit device layer 515, 615, and may thereby compensate for potential bow that could otherwise be incurred by the different thermal expansions between the circuit device array 517, 617 and the first epoxy mold compound 507, 607.

Figure 8:
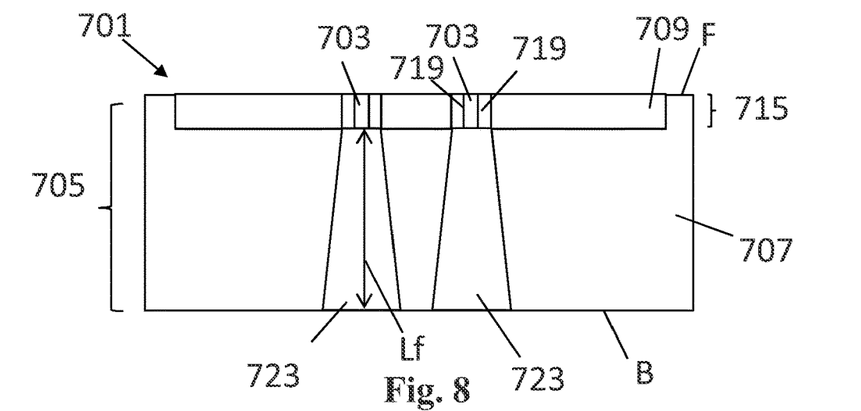
FIG. 8 illustrates a diagram of an example fluid circuit package in a cross sectional side view.
Figure 9:
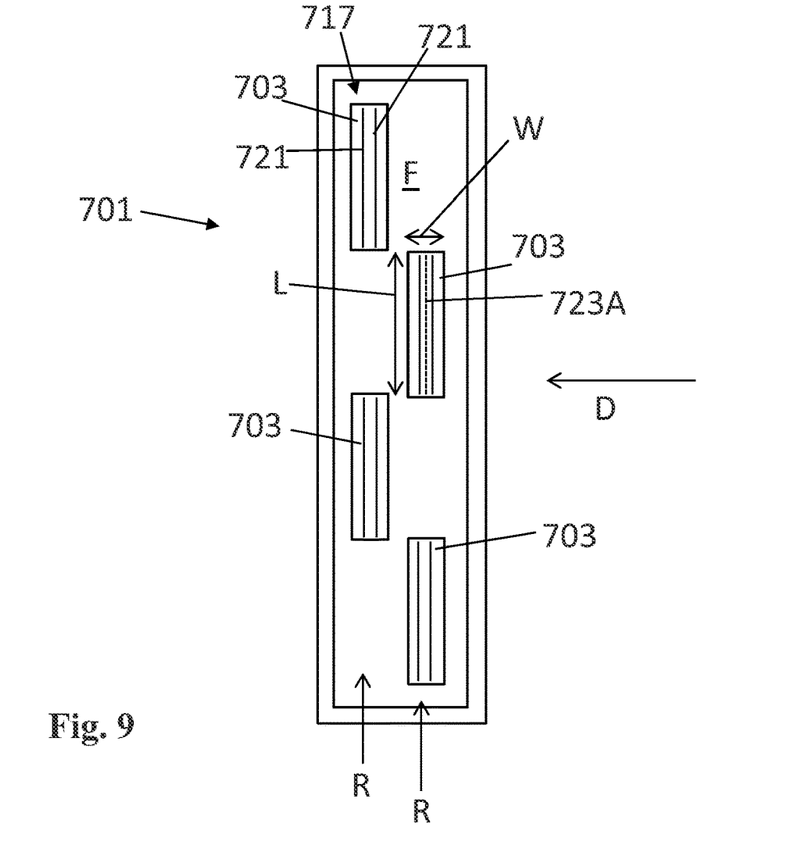
FIG. 9 illustrates a diagram of an example fluid circuit in a top view.

FIGS. 8 and 9 illustrate a panel-shaped fluidic circuit package 701 in a cross sectional side view and in a top view, respectively. The fluidic circuit package 701 includes a packaging 705 of a first and second epoxy mold compound 707, 709, respectively, wherein the second epoxy mold compound 709 has a higher CTE than the first epoxy mold compound 707. An array 717 of fluidic circuit devices 703 is disposed in a circuit device layer 715 near a front surface F. In this example the circuit device layer 715 defines the front surface F.

The fluid circuit package 701 may be a component of a high precision digital liquid dispensing module such as a media wide array print bar for two-dimensional or three-dimensional printing. The fluid circuit devices 703 may be shaped like relatively thin slivers, and may include silicon material. Each of the circuit devices 703 includes channels 719 to transport fluid (FIG. 8). In an example the fluid circuit devices 703 include nozzles at respective ends of the channels 719. Certain actuators such as resistors may be disposed in the channels 719 near the nozzles, for example in respective chamber portions of the channels. Arrays 721 of nozzles may open into the front surface F (FIG. 9). A nozzle density of one row of nozzles may for example be at least approximately 300 nozzles per inch, at least 600 nozzles per inch, at least 900 nozzles per inch, at least 1200 nozzles per inch, or more. In an example, each fluid circuit device 703 is provided with at least two nozzle arrays 721. Besides being relatively thin, in a further example, the fluid devices 703 have a relatively small width W and long length L. For example a ratio of length L versus width W may be at least approximately 25:1 or at least 50:1. The fluid circuit devices 703 may be arranged in two rows R so that subsequent nozzle arrays 721 in opposite rows R overlap so as to have continuous coverage of nozzle arrays as seen from a side direction D perpendicular to said length L of the fluid circuit devices 703, as best illustrated by FIG. 9.

The packaging 705 includes through bores in the form of fluid holes 723 to deliver fluid to each of the fluid circuit devices 703. In an example, average cross-sectional diameters of the fluid holes 723 are larger than the average cross sectional diameters of the fluid channels 719 of the devices 703. The fluid holes 723 open into the back surface B of the packaging 705 and lead to each of the fluid circuit devices 703. An array 723A of fluid holes 723 may extend into the drawing, parallel to each of the nozzle arrays 721, as illustrated by a dotted line in one of the circuit devices 703 in FIG. 9. One row of fluid holes 723 may guide fluid to two nozzle arrays 721. The fluid holes 723 may open in to a manifold channel that leads to both nozzle arrays 721.

In an example, most of the length Lf of the fluid holes 723 extend through the first epoxy mold compound 707. For example, the fluid holes 723 extend entirely in the first epoxy mold compound 707. In another example, a final portion of the fluid holes 723, near the circuit devices 703, extend through the second epoxy mold compound 709.

Figure 10:
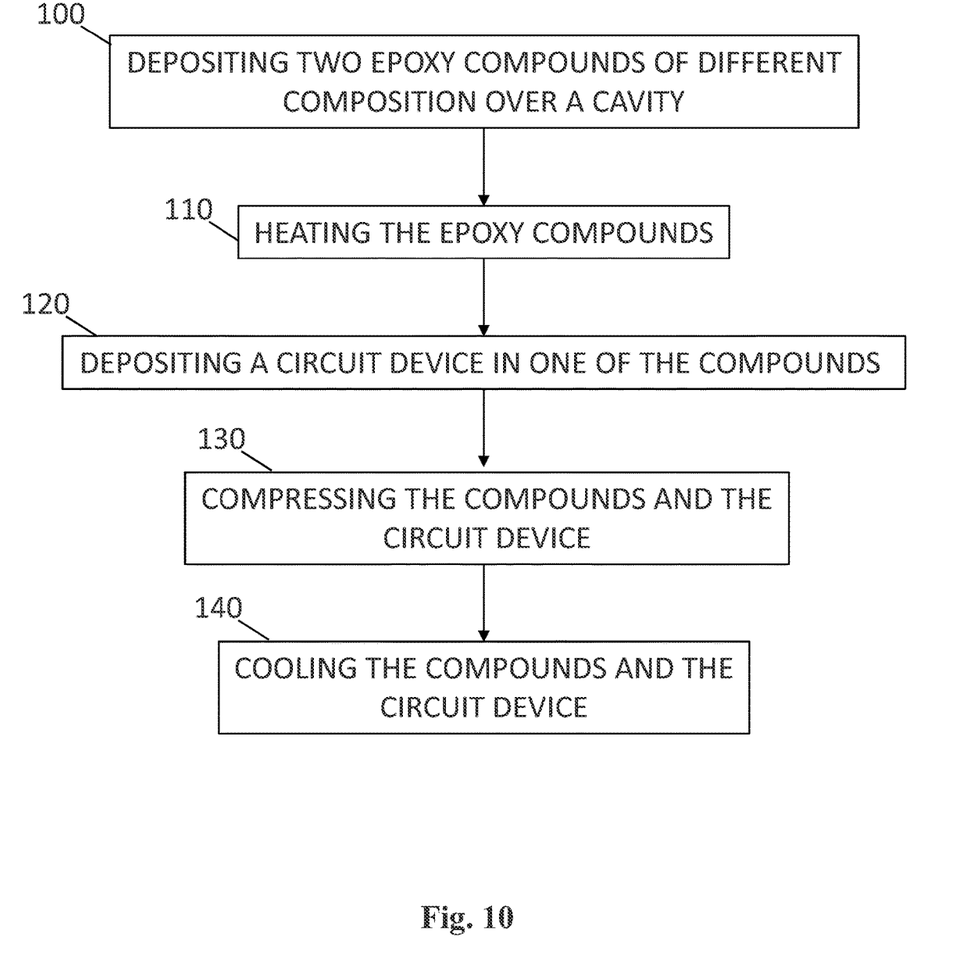
FIG. 10 illustrates a flow chart of an example method of compression molding a circuit package.

FIG. 10 illustrates a flow chart of an example of a method of compression molding. The example method is further illustrated in diagrammatic drawings in FIGS. 11A and 11B. Below, block numbers refer to the flow chart of FIG. 10 and reference numbers refer to the drawings of FIGS. 11A and 11B. The method of compression molding includes depositing at least two epoxy mold compounds 807, 809 of different compositions over a mold cavity 825 (block 100, FIG. 11A). In one example, the each of the epoxy mold compounds involve granular epoxy mold compounds. In one example the different compositions may involve different filler densities and different CTEs. The method further includes heating the compounds 807, 809 (block 110, FIG. 11A) in the cavity. The method further includes depositing at least one circuit device 803 in at least one of the epoxy mold compounds 807, 809 (block 120, FIG. 11B). The circuit device 803 may be deposited in the epoxy mold compounds 807, 809 while compressing the epoxy mold compounds 807, 809 (block 130). The method further includes cooling the circuit device 803 and the epoxy mold compounds 807, 809 (block 140, FIG. 11B).

Figure 11A:
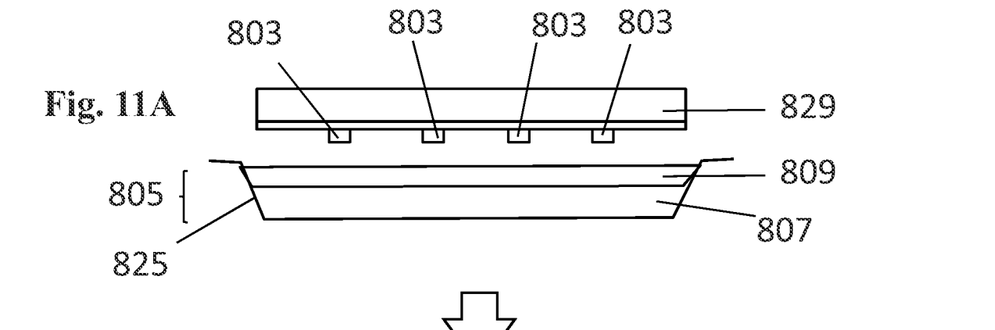
FIG. 11A illustrates a diagram of an example circuit and package materials before compression molding.

FIG. 11A illustrates a mold cavity 825 with two layers of epoxy mold compound 807, 809, for example granular epoxy mold compounds 807, 809, placed in the mold cavity 825. In the illustrated example, a layer of a second epoxy mold compound 809 with a higher CTE is placed over a layer of a first epoxy mold compound 807 with a lower CTE. The layer of the first epoxy mold compound 807 may be thicker than the layer of the second epoxy mold compound 809. A mold tool 829 is to deposit the circuit devices 803 into to the heated second epoxy mold compound 809 while compressing the epoxy mold compound. In a further example, at least one mold tool 829 is to deposit multiple layers of different epoxy mold compounds of different compositions. In different examples, the mold tool can dispense different layer thicknesses, layer sequences, and pattern the compounds in an X-Y plane X-Yerpendicular to the extrusion direction, such as in the examples of FIGS. 6 and 7.

Figure 11B:
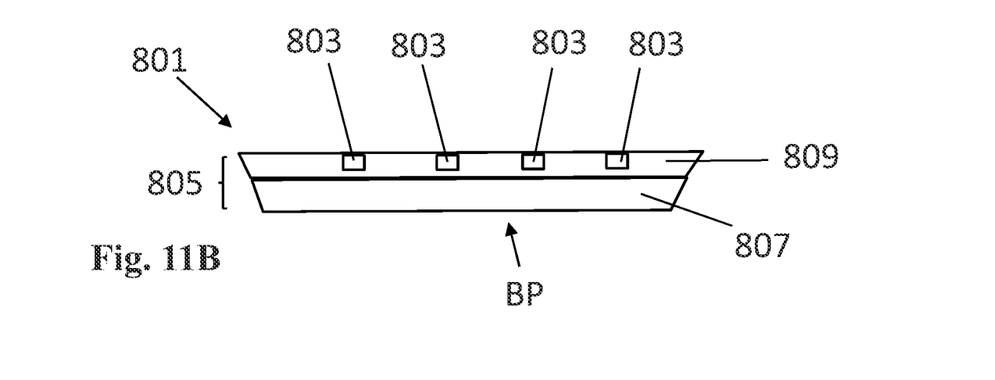

FIG. 11B illustrates a panel-shaped, cooled circuit package 801 wherein the circuit devices 803 have been deposited in the second epoxy mold compound 809. A back portion BP of the circuit package 803 is formed by the first epoxy mold compound 807. Most of the volume of the circuit packaging 805 is formed by the first epoxy mold compound 807.

Figure 12:
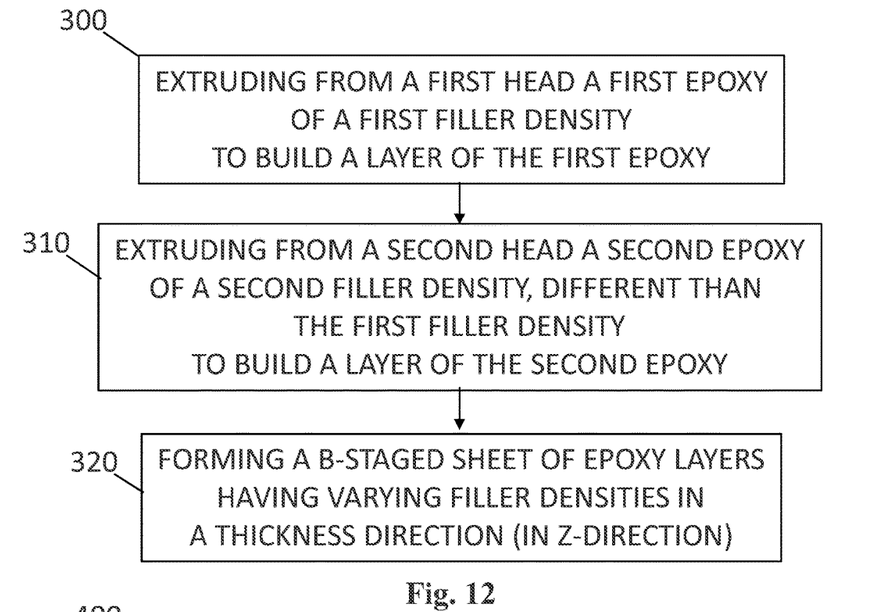
FIG. 12 illustrates a flow chart of an example method of forming a B-staged sheet mold.
Figure 13:
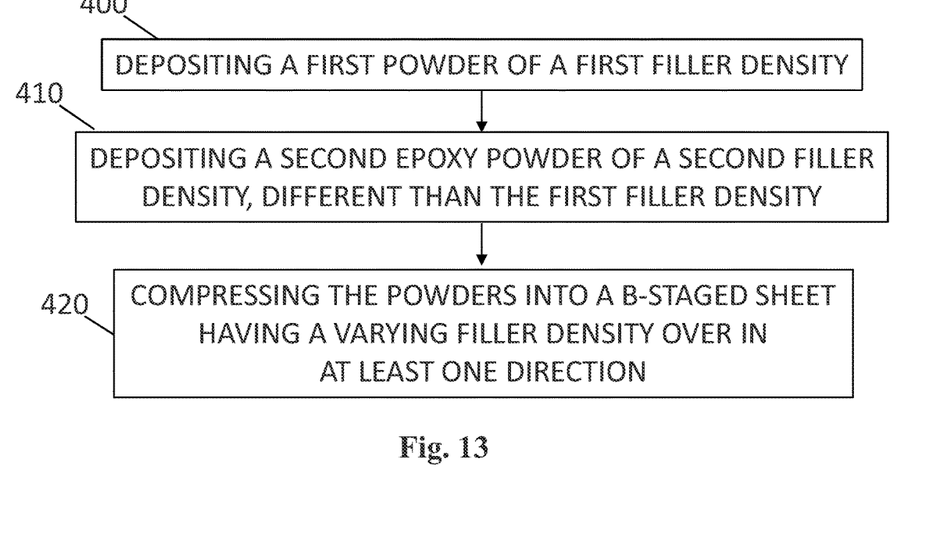
FIG. 13 illustrates a flow chart of another example method of forming a B-staged sheet mold.
Figure 14:
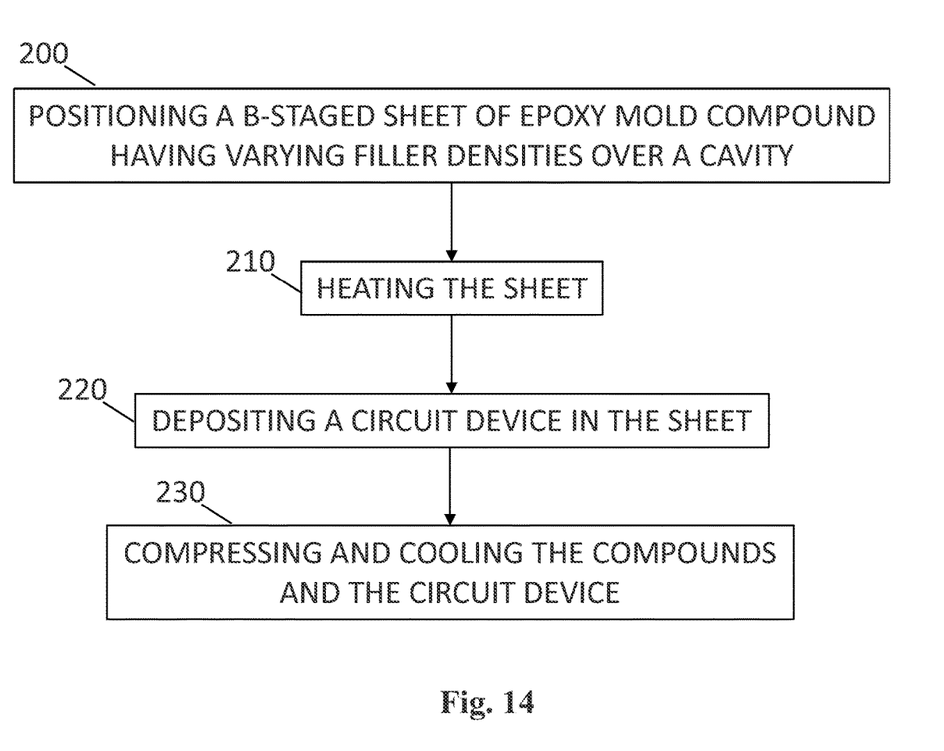
FIG. 14 illustrates a flow chart of another example method of compression molding a circuit package.
Figure 15:
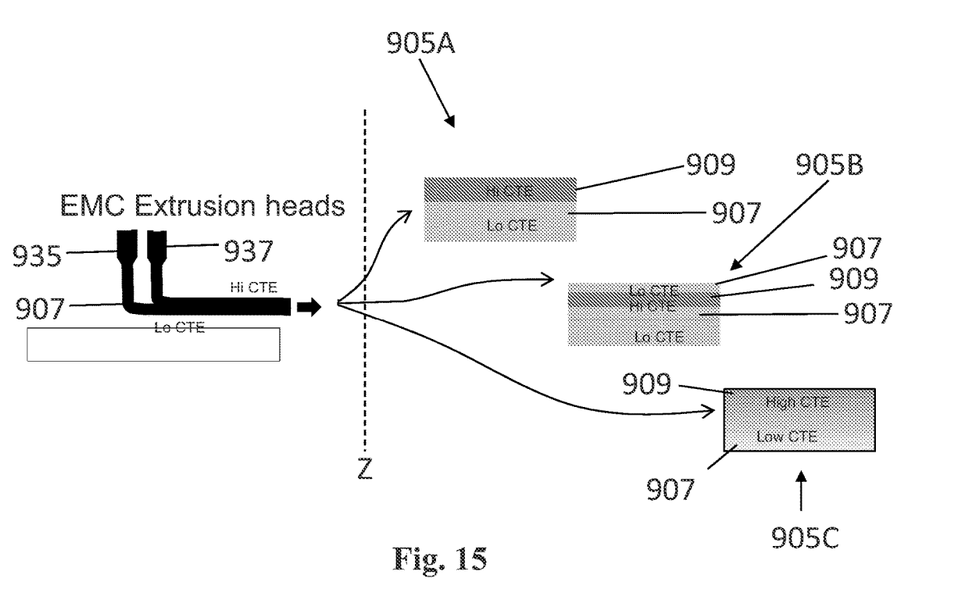
FIG. 15 illustrates a diagram of an example of an extrusion tool and resulting example B-staged sheet molds.

FIGS. 12 and 13 illustrate a flow chart of an example of a method of manufacturing b-staged sheets of epoxy mold compounds, each sheet having a varying filler density over its cross section. FIG. 14 illustrates a flow chart of an example of a method of sheet compression molding a circuit package of this disclosure using B-staged sheets of one of the example methods of FIGS. 12 and 13. FIG. 15 illustrates an extrusion tool to manufacture B-staged sheets and corresponding examples of B-staged sheets.

In the example method of FIG. 12, a heated first epoxy mold compound of a first filler density is extruded through a first extrusion head, to build a first layer of the first epoxy mold compound (block 300). Subsequently or concurrently, a heated second epoxy mold compound of a second filler density, different than the first filler density, is extruded through a second extrusion head to build a second layer of the second epoxy mold compound (block 310). For example compression or cooling may be applied to the combined layers. The two layers then form a B-staged sheet of epoxy mold compound layers of varying filler densities in a thickness or Z-direction (see FIG. 15) (block 320). For comparison, examples of a first and second extrusion head 935, 937 and B-staged sheets 905A, 905B, 905C having varying filler densities in a Z-direction are illustrated in FIG. 15. In other examples more than two epoxy mold compound layers of different filler densities can be stacked to form a B-stage sheet having a filler density gradient in a Z-direction.

Another example method of forming a B-staged sheet of epoxy mold compound having varying filler densities is illustrated in FIG. 13. In FIG. 13, a first powder of a first epoxy mold compound of a first filler density is dispensed (block 400). Subsequently or concurrently, a second powder of a second epoxy mold compound of a second filler density, different than the first filler density, is dispensed over or in the first epoxy mold compound (block 410). The powders of different filler densities may then be compressed and/or cooling to form a B-staged sheet of an epoxy mold compound having a varying filler densities in at least one direction (block 420), for example a thickness or Z-direction.

FIG. 14 illustrates an example of a method of compression molding a circuit package using B-staged epoxy mold compound sheets of varying filler densities. As said, in this disclosure, a filler density may refer to a weight percentage of fillers. The example method includes positioning a B-staged sheet of epoxy mold compound having varying filler densities in at least one direction in a mold cavity (block 200). The method further includes heating the sheet in the mold cavity (block 210). The method further includes depositing at least one circuit device in the sheet (block 220). For example, the circuit device is deposited near a front side of the sheet near layers of a relatively low filler density, opposite to a backside that has a relatively high filler density. The method may further include compressing and cooling the compounds and circuit device so as to form a circuit package (block 230).

FIG. 15 illustrates a diagram of an example of first and second epoxy mold compound extrusion heads 935, 937, respectively, to form B-staged sheets 905, 905B, 905C of epoxy mold compound having varying filler densities. These "sheets" are also known in industry as "sheet molds". Each sheet 905A, 905B, 905C may include a first layer of a first epoxy mold compound 907 and a second layer of a second epoxy mold compound 909, wherein the first epoxy mold compound 907 has a higher filler density and/or lower CTE than the second epoxy mold compound 909.

A first extrusion head 935 may be arranged to dispose a first epoxy mold compound 907 with a relatively high filler density and/or relatively low CTE. A second extrusion head 937 may be arranged to dispose a second epoxy mold compound 909 with a relatively low filler density and/or relatively high CTE, for example over the first epoxy mold compound 907. The extrusion heads 935, 937 may be arranged to dispose the epoxy mold compounds 907, 909 in layers. Further extrusion heads may be provided to dispense more layers of different filler densities or the same extrusion heads may dispense further layers of again different filler densities. In the example, the layers 907, 909 are stacked in a direction parallel to a Z-axis Z. In certain examples not illustrated here, certain part-layers of a second compound may be patterned within part-layers of a different compound of different filler density and/or CTEs (see for example FIG. 6 or 7) before forming the B-stage sheet 905A, 905B, and 905C.

In a first example, a sheet 905A includes a relatively thin second layer of a second epoxy mold compound 909 over a first layer of a first epoxy mold compound 907. In this example the circuit devices may be deposited in the second layer 909. In a second example, a packaging 905B includes a relatively thin first layer of a first epoxy mold compound 907 that is deposited over an again relatively thin second layer of a second epoxy mold compound 909 that in turn is disposed over a relatively thick first layer of a first epoxy mold compound 907, the latter near a back side. In this example the circuit devices are deposited in the relatively thin first layer 907 at a front side, on the opposite side of the relatively thick first layer 907 at the back side. In a third example, a packaging 905C includes layer of a second epoxy mold compound 909 near a front side and a layer a first epoxy mold compound 907 at a back side. Between the layer of the second epoxy mold compound and the layer of the first epoxy mold compound a filler density gradient is provided wherein, for example, the filler density increases in a direction parallel to the Z-axis Z, towards the back side. The gradient may be formed by a multitude of layers of varying filler densities. The circuit devices can again be deposited in the front side, through the layer of the second epoxy compound having the lower filler density.

Some of the described example packagings and B-stage sheets of this disclosure include multiple epoxy mold compounds having different CTEs. In an example, the CTEs of the epoxy mold compounds of this description can be determined by a weight percentage of fillers in the epoxy mold compound. For example, the CTE is inversely proportional to a filler concentration in the compound. In one example the first epoxy mold compound has a weight percentage of fillers of approximately 90%, corresponding to a CTE of approximately 6 ppm/C. An example of an industry standard epoxy mold compound having such characteristics is CEL400ZHF40W from Hitachi Chemical, Ltd®. For example the second epoxy mold compound has a weight percentage of fillers of approximately 87% and a CTE of approximately 9 ppm/C. An example of an industry standard epoxy mold compound having such characteristics is CEL400ZHF40W-87. In other examples the weight percentage of filler in the first epoxy mold compound can be between 87 and 91%. For example the CTE of the first epoxy mold compound can be between approximately 6 and 9 ppm/C. In another example the weight percentage of filler in the second epoxy mold compound can be between 82 and 87%. For example, the CTE of the second epoxy mold compound is between 9 and 14 ppm/C. A different example of different CTEs of the first and second epoxy mold compound is 6 ppm/C and 13 ppm/C, respectively. An example of a CTE of a silicon of which a circuit device may be composed is approximately 3 ppm/C.

The examples of this disclosure describe placement of an extra epoxy mold compound of a relatively high CTE, next to the circuit devices. Effects of the circuit packages of this disclosure may include at least one of reducing bow, increasing design space, and eliminating the need to add components or manufacturing process steps.

Although in different examples of this disclosure, mostly epoxy mold compounds are described, other mold compounds may also be suitable for compression molding and/or for providing a circuit package of this disclosure.

The circuit package of the various examples described in this disclosure may be a subcomponent of a larger package or device, or an intermediate product of an end product. For example multiple other layers or components can be attached to the back or front surface. Hence, when the circuit package is a subcomponent, the back or front surface may not be visible or not apparent.

The various examples of circuit packages and manufacturing methods may relate to integrated circuit packaging for example for computer components. In further examples, the packages and methods may involve fluidic applications such as 2D or 3D printing, digital titration, other microfluidic devices, etc.

Also the circuit package can have any orientation: the descriptive terms "back" and "front" should be understood as relative to each other only. Also, the example sheets or panels of this disclosure have a thickness in a Z-direction and a width and length along an X-Y plane. The thickness of the package may be relatively thin with respect to the width and length. In certain examples, the filler density varies over the thickness.

What is claimed is:

1. A circuit package, comprising:
   a packaging,
   a circuit device in the packaging, the circuit device comprising a fluid channel,
   wherein the packaging comprises a first epoxy mold compound with a first coefficient of thermal expansion (CTE) and a second epoxy mold compound with a second CTE higher than the first CTE, the second epoxy mold compound being disposed adjacent to the circuit device, and the circuit device touching the first epoxy mold compound, and
   wherein the first epoxy mold compound includes a fluid hole in communication with the fluid channel of the circuit device.

2. The circuit package of claim 1, wherein
   the second epoxy mold compound extends in a same plane as the circuit device, and
   the first epoxy mold compound extends under the second epoxy mold compound and under the circuit device.

3. The circuit package of claim 1, comprising an array of circuit devices.

4. The circuit package of claim 1, wherein the first epoxy mold compound has a higher weight percentage of fillers than the second epoxy mold compound.

5. The circuit package of claim 1, wherein a weight percentage of fillers in the first and second epoxy mold compounds increases in at least one direction away from the circuit device.

6. The circuit package of claim 1, wherein a total volume of the second epoxy mold compound is less than a total volume of the first epoxy mold compound.

7. The circuit package of claim 1, wherein a thickness of the first epoxy mold compound is greater than a thickness of the second epoxy mold compound.

8. The circuit package of claim 1, wherein the circuit device is at least partially embedded within the second epoxy mold compound.

9. The circuit package of claim 8, wherein a portion of the circuit device protrudes from the second epoxy mold compound and touches the first epoxy mold compound.

10. The circuit package of claim 1, wherein the circuit device is embedded within the first epoxy mold compound.

11. The circuit package of claim 10, wherein the first epoxy mold compound comprises a plurality of layers, and the second epoxy mold compound comprises a layer between two layers of the plurality of layers.

12. A circuit package comprising:
    a panel-shaped packaging including multiple epoxy mold compounds and a front and back surface,
    a circuit device in the circuit package near the front surface, the circuit device comprising a fluid channel,
    the packaging comprising a relatively thick layer of epoxy mold compound with a first coefficient of thermal expansion (CTE) near the back surface, and a relatively thin layer of epoxy mold compound with a second CTE higher than the first CTE near the front surface, and the circuit device touching the relatively thick layer of epoxy mold compound,
    wherein the relatively thick layer of epoxy mold compound includes a fluid hole in communication with the fluid channel of the circuit device.

13. The circuit package of claim 12, wherein the circuit device is at least partially embedded within the relatively thin layer of epoxy mold compound.

14. The circuit package of claim 13, wherein a portion of the circuit device protrudes from the relatively thin layer of epoxy mold compound and touches the relatively thick layer of epoxy mold compound.

15. The circuit package of claim 12, wherein the circuit device is embedded within the relatively thick layer of epoxy mold compound.

16. The circuit package of claim 15, wherein the relatively thick layer of epoxy mold compound comprises a plurality of layers, and the relatively thin layer of epoxy mold compound comprises a layer between two layers of the plurality of layers.

* * * * *

UNITED STATES PATENT AND TRADEMARK OFFICE
CERTIFICATE OF CORRECTION

PATENT NO. : 10,276,468 B2  
APPLICATION NO. : 15/544798  
DATED : April 30, 2019  
INVENTOR(S) : Chien-Hua Chen et al.

Page 1 of 1

It is certified that error appears in the above-identified patent and that said Letters Patent is hereby corrected as shown below:

On the Title Page

In Column 2, item (74), Attorney, Agent, or Firm, Line 1, delete "Inc. ~" and insert -- Inc. - --, therefor.

Signed and Sealed this
Fifteenth Day of October, 2019

Andrei Iancu
*Director of the United States Patent and Trademark Office*